Aug. 19, 1958 J. B. SCHULTZ 2,848,603

AUTOMATIC GAIN CONTROL SYSTEM

Filed July 2, 1956 2 Sheets-Sheet 1

INVENTOR.
JOHN B. SCHULTZ

BY H. C. Newton

ATTORNEY

INVENTOR.
JOHN B. SCHULTZ
BY H. W. Newton
ATTORNEY 2,848,603
Patented Aug. 19, 1958

2,848,603

AUTOMATIC GAIN CONTROL SYSTEM

John B. Schultz, Glenolden, Pa., assignor to Radio Corporation of America, a corporation of Delaware Application July 2, 1956, Serial No. 595,175
5 Claims. (Cl. 250—20)

This invention relates to automatic gain control systems for radio signal receivers and the like, and in particular to such gain control systems for radio signal receivers of the type employing transistors in the signal translating or amplifying portions thereof.

Signal receivers are generally provided with an automatic gain control (AGC) system for maintaining the amplitude of the intermediate frequency signal applied to the second detector substantially constant over a relatively wide range of variation in the amplitude of the received signal. By providing an AGC system for a receiver it may be tuned from strong to relatively weak signals without the necessity of resetting the manual gain or volume control. In signal receiving systems employing transistors, a crystal diode is often used as the second detector and AGC source. An automatic gain control voltage or current, which is derived from the diode, is applied to one or more of the transistor intermediate frequency (I. F.) amplifiers to control the gain thereof. The typical I. F. amplifier of such systems includes a transistor connected from common emitter amplifying operation. To stabilize the operating point of the transistor, an impedance element such as a resistor of predetermined resistance is connected in circuit with the emitter electrode. This resistor, while tending to stabilize the operating point of the transistor, is degenerative. In the typical prior art circuits one electrode of the second detector-AGC diode is connected with the base electrode of the transistor I. F. amplifier and the other electrode of the diode is connected through ground to the end of the degenerative emitter resistor which is remote from the emitter electrode. While providing AGC action, this type of circuit is not entirely satisfactory since the application of AGC signals to the transistor will result in direct-current degeneration across the emitter resistor, thus reducing the effectiveness of the AGC action.

It is accordingly an object of this invention to provide improved circuit means in a transistorized signal receiving system utilizing a diode detector for obtaining reliable and effective automatic gain control of the signal amplifying portions of the system.

It is another object of this invention to provide an improved AGC circuit for a transistorized radio signal receiver wherein reliable and effective automatic gain control is obtained without direct-current degeneration.

In accordance with the invention, the diode detector of a transistor signal receiver is connected with one or more preceding transistor amplifier stages in such a manner that undesired degeneration of direct currents is eliminated. This is accomplished by connecting one electrode of the diode detector with the base electrode of a preceding transistor amplifier stage and connecting the other electrode of the diode detector to the junction of an emitter stabilizing resistor and the emitter of the controlled transistor. Thus, the AGC voltage is applied directly between the base and emitter electrodes of the transistor to the exclusion of the stabilizing resistor, which eliminates direct-current degeneration across the stabilizing resistor and improves the effectiveness of the automatic gain control action.

The novel features that are considered characteristic of this invention are set forth with particularity in the appended claims. The invention itself, however, both as to its organization and method of operation, as well as additional objects and advantages thereof, will best be understood from the following description when read in connection with the accompanying drawing, in which:

Figure 1:
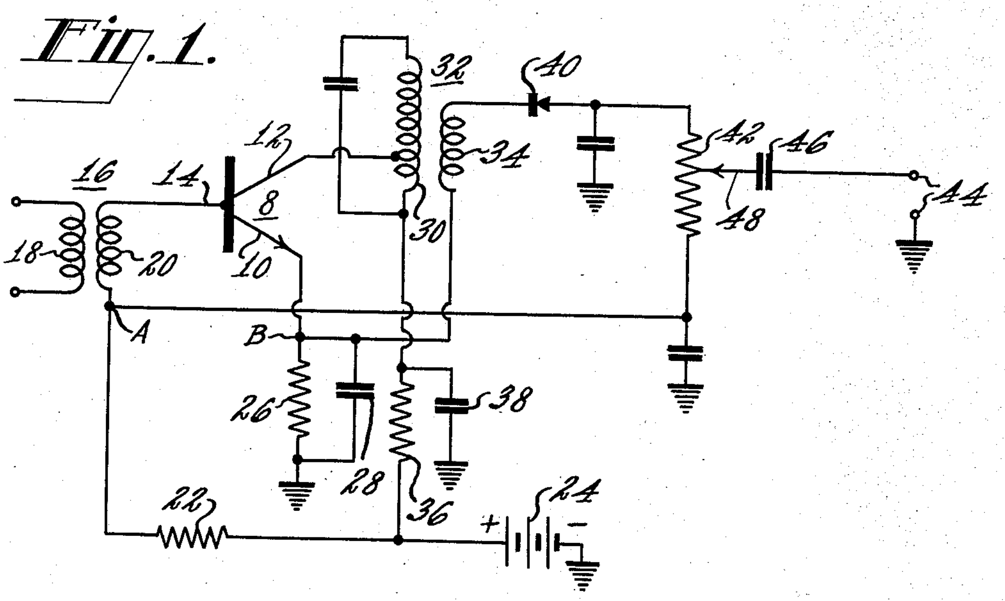
Figures 1 and 2 are schematic circuit diagrams of transistor signal amplifier and AGC systems, for radio signal receivers and the like, embodying the invention.

Referring now to the drawing wherein like parts are indicated by like reference numerals throughout the figures and referring particularly to Figure 1, a transistor 8 may be considered to be, for example, of the N–P–N junction type and includes an emitter 10, a collector 12, and a base electrode 14. The transistor 8 is connected for signal amplifying operation in the so-called common emitter configuration. In a radio receiver, for example, an input I. F. signal may be applied between the base 14 and emitter 10 through an input transformer 16 having a primary winding 18 which is in inductive coupling relation with a secondary winding 20. One end of the secondary winding 20 is connected directly to the base 14 while the other end is connected through a resistor 22 to the positive terminal of a direct-current supply source, which may be, by way of example, a battery 24. To stabilize the circuit operation of the transistor amplifier 8, its emitter electrode 10 is connected to ground through a stabilizing resistor 26. The resistor 26 provides negative current feedback. The voltage drop across the resistor 26 is essentially proportional to the collector current and is in the proper direction so that increasing current will apply reverse bias to the transistor 8. The I. F. gain of the transistor may be increased by bypassing the stabilizing resistor 26 with a by-pass capacitor 28.

Intermediate frequency output signals from the transistor 8 are derived from between the collector 12 and emitter electorde 10. To provide a tuned output circuit for the transistor 8 the collector 12 is connected to a tap on the tuned primary winding 30 of an output transformer 32. This tap point is selected so that the impedance of the output circuit is less than the output impedance of the transistor, thus damping undesired feedback and eliminating the usual neutralizing networks. To provide collector biasing potentials for the transistor 8, the collector 12 is connected through the low potential portion or end of the primary winding 30, below the tap, and a resistor 36, to the positive terminal of the battery 24. The resistor 36 and the battery 24 are by-passed for I. F. signals by a capacitor 38.

The secondary winding 34 of the output transformer 32 is connected to the cathode of a crystal diode detector 40, which may be of the commercial 1N295 type, and which serves as a detector to separate the audio frequency component from the modulated intermediate frequency signal, and also as the AGC voltage source. The anode of the diode detector 40 is connected to the high signal potential end of a volume control resistor 42 and through the resistor 22 to the positive terminal of the battery 24 which serves to apply forward bias to the diode detector 40. The audio frequency output signal is derived from a pair of output terminals 44, one of which is grounded, that is, connected to common signal ground or chassis for the amplifier or receiver. The ungrounded output terminal is connected through a coupling capacitor 46 to a variable tap 48 on the volume control resistor or potentiometer 42.

It has been the practice in prior art circuits of this type to ground the lower end of the secondary winding of the output transformer. Accordingly, the AGC voltage developed across the diode detector is applied between the base and the grounded end of the emitter stabilizing resistor of the transistor controlled stage. Thus, for example, in Figure 1 in accordance with the prior art circuits the lower end of the secondary winding 34 would be grounded. With this connection, if the applied intermediate frequency signal increases in strength, the voltage at point A in Figure 1 would become negative with respect to the emitter voltage which has the desired effect of reducing the emitter current of the transistor and hence its gain. If the emitter current decreases, however, the emitter (point B) becomes negative with respect to the base. Thus the emitter-base junction of the transistor is biased in the forward direction which tends to increase the emitter current. It is in this manner that the emitter resistor causes a degenerative effect in the prior art circuits which reduces the effectiveness of the AGC action.

In accordance with the present invention, the AGC voltage derived across the diode detector 40 is applied effectively directly between the emitter and base electrodes, thereby eliminating the degenerative effects of the prior art circuits. This is accomplished in the embodiment of the invention illustrated in Figure 1 by connecting the cathode of the diode detector 40 through the secondary winding 34 directly to the emitter 10, that is to the junction of the emitter 10 and the emitter stabilizing resistor 26 (point B). The anode of the diode detector 40 is connected through the low resistance of the volume control resistor 42, and thus effectively directly, to the base through the secondary winding 20 of the input transformer. Thus in operation, substantially all of the direct-current voltage developed across the diode detector 40 is applied directly between the base 14 and the emitter 10 of the transistor 8. As the intermediate frequency signal increases in amplitude, therefore, the point B becomes positive relative to the point A. This tends to reverse bias the emitter-base circuit of the transistor, thus reducing the gain. Accordingly, the output signal strength is maintained at a substantially constant value despite increases in the signal strength. Moreover, by connecting the diode detector 40 as shown and described, undesired direct-current degeneration across the emitter stabilizing resistor 26 is eliminated.

Figure 3:
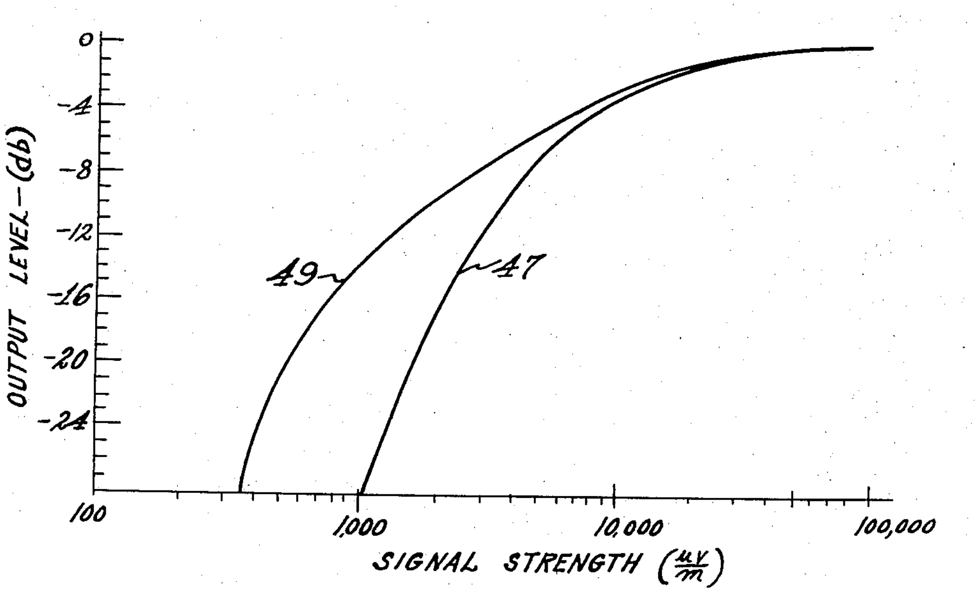
Figure 3 is a graph illustrating curves which relate signal strength to output level for prior art circuits and circuits embodying the invention.

The improvement in the effectiveness of the AGC action achieved by the present invention can be illustrated graphically. Reference is made to the graph of Figure 3, where signal output level in decibels is plotted against input signal strength in microvolts per meter on a logarithmic scale, the curve 47 illustrating the AGC curve of a prior art circuit while the curve 49 is an AGC curve of a circuit of the type embodying the invention, for example, the circuit of Figure 1. It is seen that the AGC action of circuits embodying the invention is greatly improved, particularly in the region between 300 microvolts per meter to 2000 microvolts per meter input signal strength.

It is also noted that by connecting the diode detector 40 in the circuit as shown, stabilization of the operating point of the transistor 8 is provided with variations in ambient temperature or the supply voltage. Thus, for example, if the ambient temperature increases the impedance of the diode will decrease, which will decrease the collector current.

Figure 2:
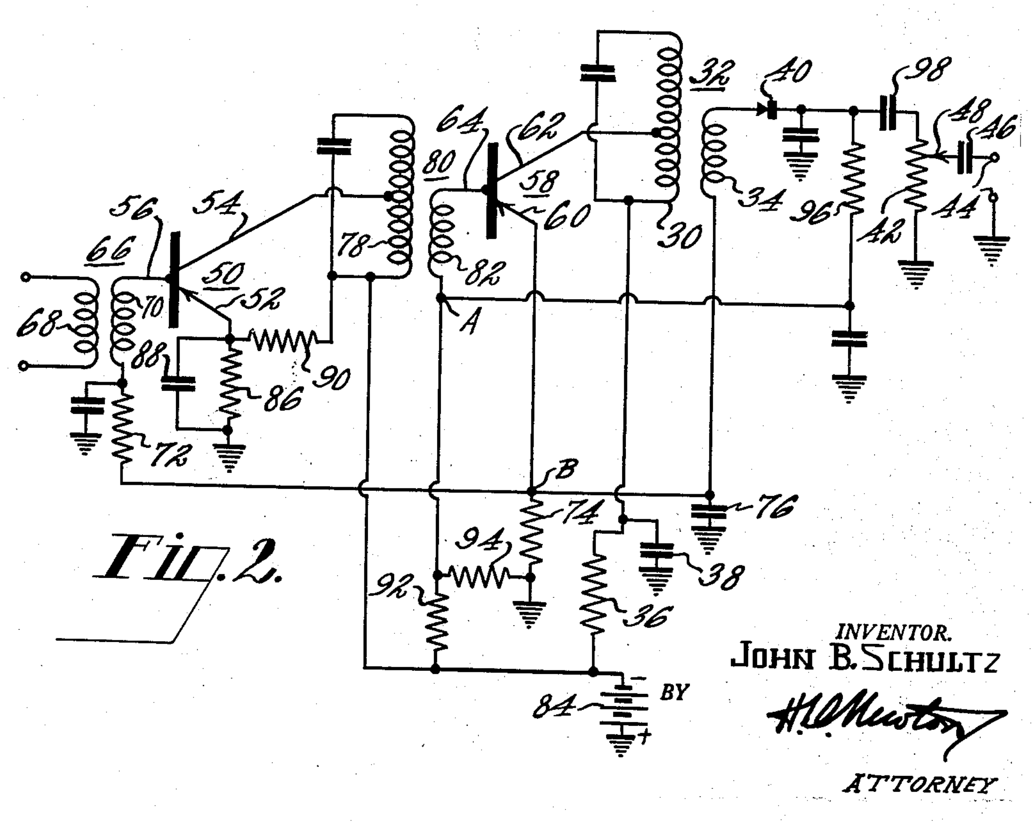

In Figure 2 a circuit embodying the invention includes a pair of intermediate frequency junction amplifiers 50 and 58 which in this case may be considered to be junction transistors of the P–N–P type. The transistor 50 includes an emitter 52, a collector 54, and a base 56. The transistor 58 similarly includes an emitter 60, a collector 62, and a base 64. Input signals are applied to the circuit through an input transformer 66 having a primary winding 68 and a secondary winding 70. One end of the secondary winding 70 is connected directly with the base 56 of the transistor amplifier 50 while the other end is connected through a pair of resistors 72 and 74 to ground. The resistor 74 is also connected with the emitter 60 of the second I. F. transistor 58 and serves to stabilize the operating point of the transistor 58 in the same manner as the emitter stabilizing resistor 36 in Figure 1. The resistor 74 is by-passed by a capacitor 76.

An amplified I. F. output signal is derived from between the collector 54 and emitter electrode 52 of the transistor 50 and applied between the base 64 and emitter electrode 60 of the second transistor I. F. amplifier 58. To accomplish this the collector 54 of the first transistor 50 is connected to an intermediate point on the primary winding 78 of a tuned output transformer 80, which also includes a secondary winding 82. The upper end of the secondary winding 82 is connected with the base 64 of the second transistor I. F. amplifier 58. To supply biasing potentials for the collector 54 of the first transistor 50, the collector 54 is connected through the lower half of the primary winding 78 to the negative terminal of a direct-current supply battery 84. To stabilize the circuit operation of the transistor 50, its emitter electrode 52 is connected through a stabilizing resistor 86 to ground. The resistor 86 is by-passed for I. F. signal frequencies by a by-pass capacitor 88. To maintain the emitter voltage of the transistor 50 constant, the emitter 52 is also connected through a resistor 90 to the negative terminal of the battery 84.

The base 64 of the second transistor I. F. amplifier 58 is connected through the secondary winding 82 and a resistor 92 to the negative terminal of the battery 84. A resistor 94 is connected between the junction of the secondary winding 82 and the resistor 92 to ground. The resistors 92 and 94 comprise a bleeder network which improves circuit stability with temperature variation and the interchanging of transistors in the circuit.

The secondary winding 34 of the output transformer 32 is connected to the anode of the crystal diode detector 40 in the embodiment of the invention illustrated in Figure 2. It should be noted that the diode detector 40 is poles in an opposite direction to its counter-part in Figure 1 since the transistors used in Figure 2 are of N type conductivity. The diode 40, it should be understood, is, in either case, poled for forward conduction in an opposite direction to normal emitter-base current flow of the transistor to which the developed AGC voltage is applied. In order that the volume control tap can be brought directly to ground so as to obtain an acceptable minimum volume, the diode detector 40 is connected through a resistor 96 to the point A instead of through the volume control resistor 42 as in Figure 1. The diode detector 40 is also connected through a capacitor 98 to the high signal potential end of the volume control resistor 42. As in Figure 1, the diode detector 40 is connected through the secondary winding 34 to the emitter 60 (point B) so that the developed AGC voltage is applied effectively directly between the base 64 and the emitter 60 of the transistor 58, thus eliminating undesired direct-current degeneration across the emitter stabilizing resistor 74. In operation, the circuit illustrated in Figure 2 is similar to the one illustrated in Figure 1 except that the polarity of all bias voltages, since the transistors used are of N type conductivity, is opposite to the polarity provided in the circuit of Figure 1.

While it will be understood that the circuit specifications may vary according to the design for any particular application, the following circuit specifications are included for the circuit of Figure 2 by way of example only:

| | |
|---|---|
| Transistors 50 and 58 | Commercial type 2N139. |
| Diode 40 | Commercial type 1N295. |
| Resistors 36; 42; 72; 74; 86; 90; 92; 94; and 96 | 470; 10,000; 1,000; 3,900; 1,200; 3,300; 15,000; 15,000; and 5,600 ohms respectively. |
| Capacitors 38; 46; 76; 88; 98 | .1; 10; 10; .1; and 10 microfarads, respectively. |
| Battery 84 | 9 volts. |

Automatic gain control of transistor amplifiers is accomplished, in accordance with the invention, without direct-current degeneration. Accordingly, circuits embodying the invention are characterized by effective and relative automatic gain control without sacrificing circuit stability.

What is claimed is:

1. In a radio signal receiving system, the combination with a transistor intermediate frequency signal amplifier having a base, an emitter, and a collector electrode; transformer signal input means including a secondary winding connected with said base electrode for applying an intermediate frequency input signal between said base and emitter electrodes; tuned signal output means connected with said collector electrode for deriving therefrom an amplified intermediate frequency output signal; and stabilizing means including a resistor connected between said emitter electrode and ground; of a crystal diode detector having a pair of electrodes and coupled with said output means to detect an audio frequency signal and develop an automatic gain control potential in response to said amplified intermediate frequency signal; means including a volume control resistor direct-current conductively connecting one of the electrodes of said diode detector with said secondary winding; and means including said output means direct-current conductively connecting the other electrode of said diode detector with the junction of said emitter electrode and said resistor; said diode being poled in said circuit for forward conduction in a direction opposite to normal base-emitter current flow of said transistor and defining with the base and emitter electrodes of said transistor a series direct-current conductive circuit for applying said automatic gain control potential directly between the base and emitter electrodes of said transistor to the exclusion of said resistor and controlling the gain thereof in accordance with variation in the amplitude of said intermediate frequency signal.

2. In a radio signal receiving system the combination with a transistor intermediate frequency signal amplifier having a base, an emitter, and a collector electrode; transformer signal input means including a secondary winding connected with said base electrode for applying an intermediate frequency input signal between said base and emitter electrodes; a first resistor connected between said secondary winding and a direct-current supply source; tuned signal output means connected with said collector electrode for deriving an amplified intermediate frequency signal between said collector and emitter electrodes; stabilizing means including a negative feedback resistor connected between said emitter electrode and ground; and means connecting said collector electrode with said supply source; of a crystal diode detector having a pair of electrodes; means coupling one of said electrodes with said output means whereby said diode detector is operative to detect an audio frequency signal and develop an automatic gain control potential in response to said amplified intermediate frequency signal; means including a volume control resistor direct-current conductively connecting the other electrode of said diode detector with the junction of said secondary winding and said first resistor; and means including said output means direct-current conductively connecting said one of said electrodes of said diode detector with the junction of said emitter electrode and said resistor; said diode being poled in said circuit for forward conduction in a direction opposite to normal base-emitter current flow of said transistor and defining with the base and emitter electrodes of said transistor a series direct-current conductive circuit for applying said automatic gain control potential directly between the base and emitter electrodes of said transistor and controlling the gain thereof in accordance with variation in the amplitude of said intermediate frequency signal.

3. In a radio signal receiving system, the combination with a transistor intermediate frequency signal amplifier having a base, an emitter, and a collector electrode; transformer signal input means including a secondary winding connected with said base electrode for applying an intermediate frequency input signal between said base and emitter electrodes; signal output means connected with said collector electrode for deriving therefrom an amplified intermediate frequency output signal; and stabilizing means including a resistor connected between said emitter electrode and ground; of a diode detector having a pair of electrodes and coupled with said output means to detect an audio frequency signal and develop an automatic gain control potential in response to said amplified intermediate frequency signal; means direct-current conductively connecting one of the electrodes of said diode detector with said secondary winding; and means including said output means direct-current conductively connecting the other electrode of said diode detector with the junction of said emitter electrode and said resistor; said diode being poled in said circuit for forward conduction in a direction opposite to normal base-emitter current flow of said transistor and defining with the base and emitter electrodes of said transistor a series direct-current conductive circuit for applying said automatic gain control potential directly between the base and emitter electrodes of said transistor to the exclusion of said resistor and controlling the gain thereof in accordance with variation in the amplitude of said intermediate frequency signal.

4. In a signal receiving system the combination with a transistor signal amplifier having a base, an emitter, and a collector electrode; signal input means connected with said base electrode for applying an input signal between said base and emitter electrodes; signal output means connected with said collector electrode for deriving therefrom an amplfied output signal; and stabilizing means including a first resistor connected between said emitter electrode and a point of reference potential in said circuit; of a diode detector having a pair of electrodes and coupled with said output means to develop a direct-current automatic gain control potential and a detected output signal in response to said amplified output signal; means including a second resistor and said signal input means direct-current conductively conecting one of the electrodes of said diode with said base electrode; and means including said output means direct-current conductively connecting the other electrode of said diode with the junction of said emitter and said first resistor; said diode being poled in said circuit for forward conduction in a direction opposite to normal base-emitter current flow of said transistor and defining with the base and emitter electrodes of said transistor a series direct-current conductive circuit for applying said automatic gain control potential directly between the base and emitter electrodes of said transistor to the exclusion of said first resistor and controlling the gain of said transistor in accordance with variation in the amplitude of said amplified output signal without direct-current degeneration across said first resistor.

5. In a radio signal receiving system the combination with a transistor intermediate frequency signal amplifier having a base, an emitter, and a collector electrode; transformer signal input means including a secondary winding connected with said base electrode for applying an intermediate frequency input signal between said base and emitter electrodes; tuned signal output means connected with said collector electrode for deriving an amplified intermediate frequency signal between said collector and emitter electrodes; stabilizing means including a negative feedback resistor connected between said emitter electrode and ground; and means connecting said collector electrode with said supply source; of a diode detector having a pair of electrodes; means coupling one of said electrodes with said output means whereby said diode detector is operative to detect an audio frequency signal and develop an automatic gain control potential in response to said amplified intermediate frequency signal; means including a resistor direct-current conductively connecting the other electrode of said diode detector with said secondary winding; and means including said output means direct-current conductively connecting said one of said electrodes of said diode detector with the junction of said emitter electrode and said negative feedback resistor; said diode being poled in said circuit for forward conduction in a direction opposite to normal base-emitter current flow of said transistor and defining with the base and emitter electrodes of said transistor a series direct-current conductive circuit for applying said automatic gain control potential directly between the base and emitter electrodes of said transistor and controlling the gain thereof in accordance with variation in the amplitude of said intermediate frequency signal.

References Cited in the file of this patent

UNITED STATES PATENTS

| | | |
|---|---|---|
| 2,093,072 | Cooper | Sept. 14, 1937 |
| 2,106,207 | Crossley et al. | Jan. 25, 1938 |
| 2,144,015 | Foster | Jan. 17, 1939 |

OTHER REFERENCES

Pub. "1956 Transistor Portable Design" in Tele-Tech and Electronics Industries, April 1956, pp. 100–101.